United States Patent
Li et al.

(10) Patent No.: US 7,063,931 B2
(45) Date of Patent: Jun. 20, 2006

(54) POSITIVE PHOTORESIST COMPOSITION WITH A POLYMER INCLUDING A FLUOROSULFONAMIDE GROUP AND PROCESS FOR ITS USE

(75) Inventors: Wenjie Li, Poughkeepsie, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/753,989

(22) Filed: Jan. 8, 2004

(65) Prior Publication Data

US 2005/0153232 A1    Jul. 14, 2005

(51) Int. Cl.
*G03C 1/73* (2006.01)
*G03F 7/039* (2006.01)

(52) U.S. Cl. .................. 430/270.1; 430/905; 430/907; 430/910; 430/326

(58) Field of Classification Search ............. 430/270.1, 430/281.1, 283.1, 286.1, 905, 907, 910
See application file for complete search history.

(56) References Cited

U.S. PATENT DOCUMENTS

| 6,165,678 | A | 12/2000 | Allen et al. |
| 6,177,228 | B1 | 1/2001 | Allen et al. |
| 6,235,849 | B1 | 5/2001 | Jayaraman et al. |
| 6,420,503 | B1 | 7/2002 | Jayaraman et al. |
| 6,706,826 | B1 * | 3/2004 | Fujiwara et al. ............... 526/79 |
| 6,824,956 | B1 * | 11/2004 | Sato ......................... 430/270.1 |

* cited by examiner

*Primary Examiner*—Sin Lee
(74) *Attorney, Agent, or Firm*—Steven A. Capella, Esq.; McGinn IP Law Group, PLLC

(57) ABSTRACT

A positive photoresist composition comprises a radiations sensitive acid generator, and a polymer that may include a first repeating unit derived from a sulfonamide monomer including a fluorosulfonamide functionality, and a second repeating unit, which may include a pendant acid-labile moiety. The positive photoresist composition may also comprise at least one of a solvent, a quencher, and a surfactant. A patterned photoresist layer, made of the positive photoresist composition, may be formed on a substrate, the positive photoresist layer may be exposed to a pattern of imaging radiation, a portion of the positive photoresist layer that is exposed to the pattern of imaging radiation may be removed to reveal a correspondingly patterned substrate for subsequent processing in the manufacture of a semiconductor device.

19 Claims, 1 Drawing Sheet

POSITIVE PHOTORESIST COMPOSITION WITH A POLYMER INCLUDING A FLUOROSULFONAMIDE GROUP AND PROCESS FOR ITS USE

BACKGROUND OF THE INVENTION

1. Field of the Invention

The present invention relates to a photoresist composition and, more particularly, to a positive photoresist composition that comprises a polymer comprising a first repeating unit derived from a sulfonamide monomer including a fluorosulfonamide functionality.

2. Description of the Related Art

In the manufacture of semiconductors, the photolithographic process typically projects an ultraviolet (UV) light onto a semiconductor substrate coated with a layer of a photosensitive resist, i.e., a photoresist, through a mask that defines a particular pattern of electronic circuitry. Exposure to UV light, followed by baking, induces a photochemical reaction, which changes the solubility of the exposed regions of the photoresist. Thereafter, an appropriate developer, typically an aqueous base solution, is used to selectively remove the photoresist in the exposed regions or alternatively, in the unexposed regions, to create a patterned imaging layer. A photoresist that is removed from the exposed regions is called a positive photoresist, while a photoresist that is removed from the unexposed regions is called a negative photoresist. The patterned imaging layer typically overlies the semiconductor substrate, which may now be processed by another semiconductor manufacturing process, for example, etching or ion implantation, to create patterned processing of the now revealed semiconductor substrate.

Photoresists are generally comprised of a polymeric matrix, a radiation sensitive component, a casting solvent, and other performance enhancing additives. The polymeric matrix should have a reasonable absorption at exposure wavelengths. Another parameter to be considered in new photoresist materials is the dissolution behavior of the material in a given developer. The semiconductor industry has largely supported the use of 0.263 N tetramethyl ammonium hydroxide (TMAH) as a developer for photoresists.

In order to achieve the desired photolithographic performance, a positive photoresist should not swell upon contact with a developer and ideally, should show but slight dissolution (0–1 nm/s) in the developer before irradiation. After irradiation, positive photoresists in exposed regions should have a high dissolution rate in the developer, so that they can be easily removed and so subsequent processing is limited to the desired pattern.

To achieve the desired dissolution properties in an aqueous base developer, acidic groups are incorporated into the polymer structure. In photoresists exposed to light of a 248 nm wavelength, hydroxystyrene has been widely used as an acidic group. Hydroxystyrene, however, strongly absorbs light of a 193 nm wavelength, which is currently used in irradiating processes, and it is anticipated that irradiation processes will use even shorter wavelengths in the near future in order to enhance resolution. Instead, when using light of a 193 nm wavelength for exposure, acidic groups such as carboxylic acid (—COOH) and hexafluoroacohol (HFA) are currently used. However, COOH is a relatively strong acidic group and has a strong affinity for a base developer. Polymers with COOH tend to swell and/or quickly dissolve in an aqueous base developer. Thus, it is difficult to achieve slight dissolution in the developer before irradiation with polymers having COOH acidic groups. The HFA acidic group is much weaker than COOH. Thus, photoresists based on HFA tend to have better dissolution properties. However, due to the high fluorine content in the HFA group, the etch resistance is often a concern.

Thus, there remains a need for a positive photoresist composition that exhibits an excellent dissolution response in an aqueous base developer, and yet overcomes the above-mentioned problems associated with photoresist compositions.

SUMMARY OF THE INVENTION

In view of the foregoing and other exemplary problems and disadvantages of positive photoresists, disclosed herein is an exemplary aspect of the present invention that provides a positive photoresist composition that comprises a radiation sensitive acid generator, and a polymer. The polymer comprises a first repeating unit derived from a fluorosulfonamide monomer including one of the following structures,

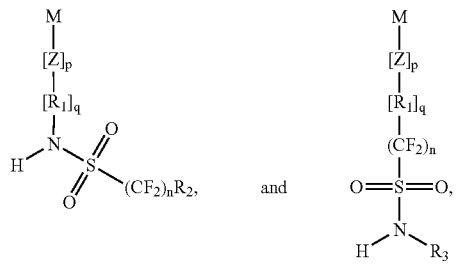

in which M is a polymerizable backbone moiety, Z is a linking moiety comprising one of —C(O)O—, —C(O)—, —OC(O)—, —O—C(O)—C(O)—O—, $R_1$ represents one of an alkyl, an aryl, a semi- or perfluorinated alkyl, and a semi- or perfluorinated aryl, p and q is 0 or 1, $R_2$ represents one of hydrogen, fluorine, an alkyl group of 1 to 6 carbons, and a semi- or perfluorinated alkyl group of 1 to 6 carbons, n is an integer from 1 to 6, and $R_3$ represents one of hydrogen, an alkyl, an aryl, a semi- or perfluorinated alkyl, and a semi- or perfluorinated aryl. In another exemplary embodiment of the present invention, the polymerizable backbone moiety, M, includes one of the following structures,

where $R_4$ represents one of hydrogen, an alkyl group of 1 to 20 carbons, a semi- or perfluorinated alkyl group of 1 to 20 carbons, and CN, and

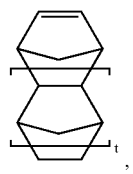

where t is an integer from 0 to 3.

In another exemplary embodiment of the present invention, the sulfonamide monomer, which includes a fluorosulfonamide functionality, comprises one of the following structures,

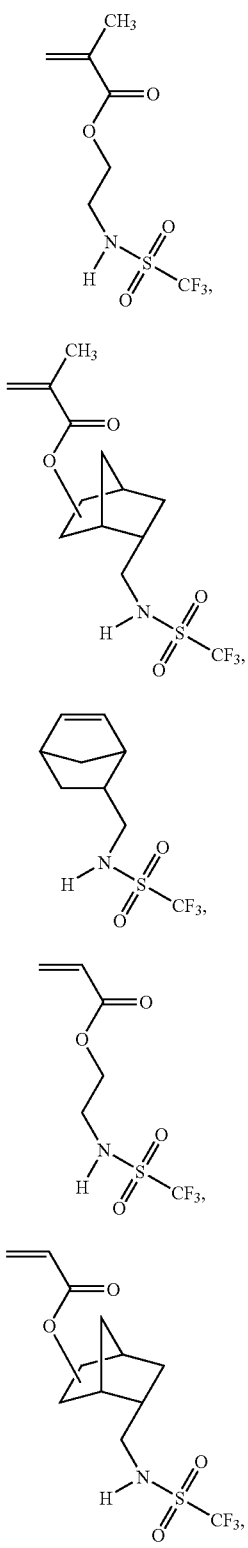

(I), (II), (III), (IV), (V)

-continued

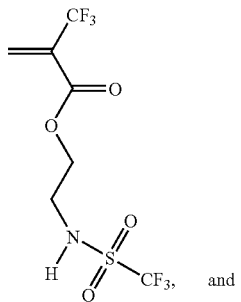

(VI)

and

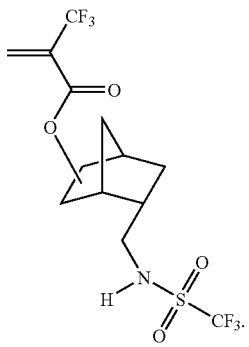

(VII)

In another exemplary embodiment of the present invention, the second repeating unit including the acid-labile pendant moiety comprises one of a tertiary alkyl carbonate, a tertiary alkyl ester, a tertiary alkyl ether, an acetal and a ketal.

In another exemplary embodiment of the present invention, the tertiary alkyl ester monomer includes one of the following structures,

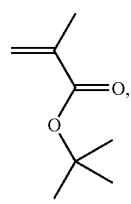

(VIII)

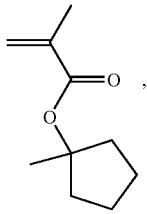

(IX)

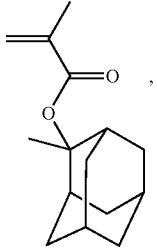

(X)

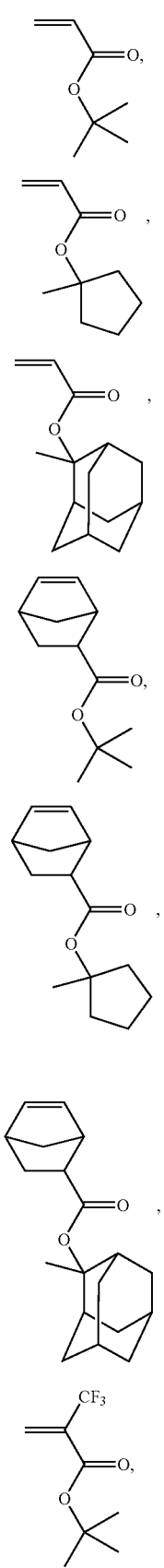
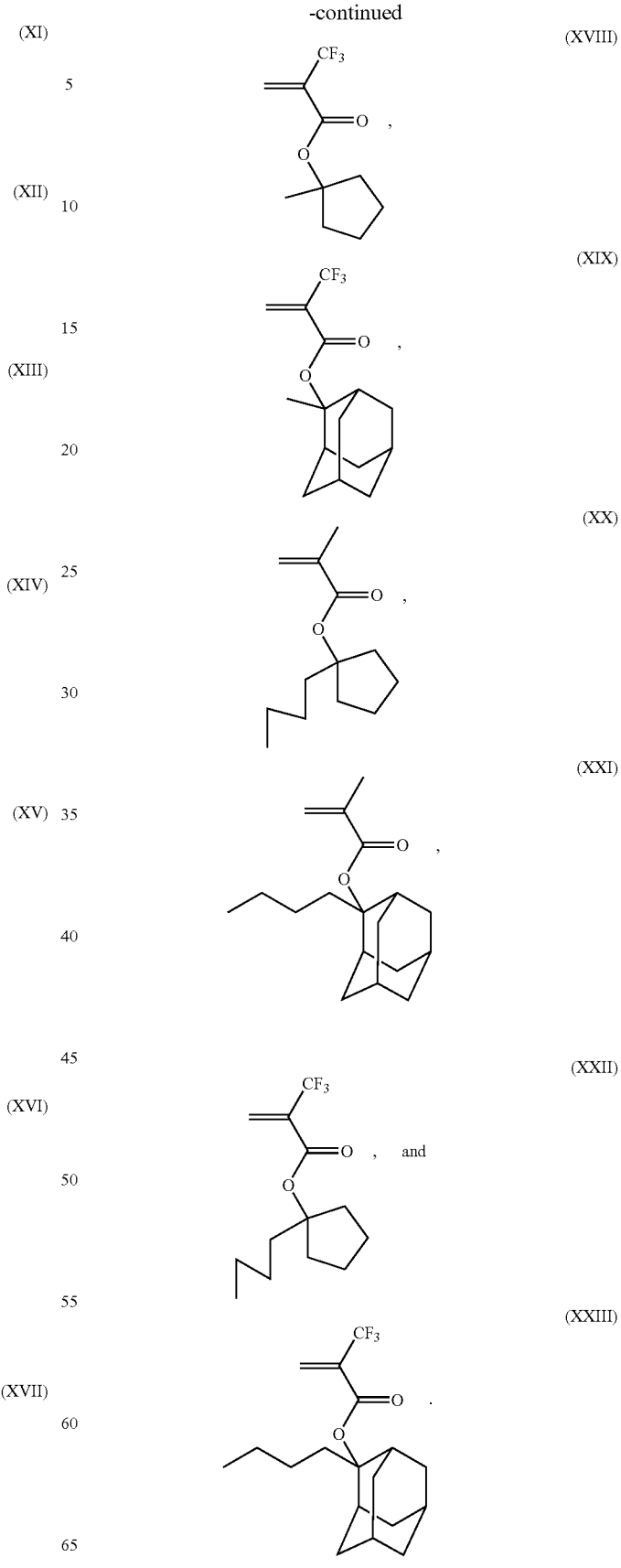

In another exemplary embodiment of the present invention, the positive photoresist further comprises a third monomer unit derived from monomers comprising one of the following structures,

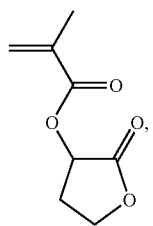
(XXIV)

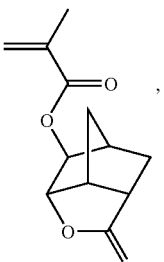
(XXV)

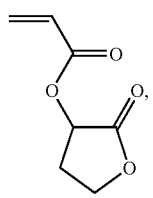
(XXVI)

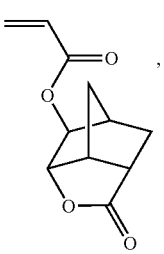
(XXVII)

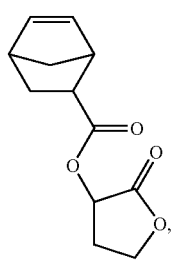
(XXVIII)

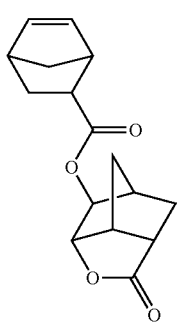
(XXIX)

-continued

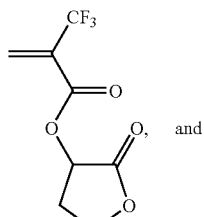
(XXX)

and

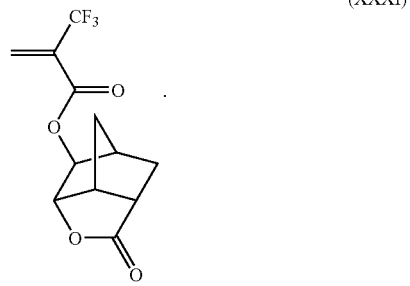
(XXXI)

In another exemplary embodiment of the present invention, the radiation sensitive acid generator comprises at least one of an onium salt, a succinimide derivative, a diazo compound, and a nitrobenzyl compound.

In another exemplary embodiment of the present invention, the radiation sensitive acid generator comprises at least one of 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl)iodonium perfluorohexane sulfonate, di(t-butylphenyl)iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide.

In another exemplary embodiment of the present invention, the positive photoresist further comprises at least one of a solvent, a quencher, and a surfactant.

In another exemplary embodiment of the present invention, the solvent comprises at least one of an ether, a glycol ether, an aromatic hydrocarbon, a ketone, and an ester.

In another exemplary embodiment of the present invention, the solvent comprises at least one of propylene glycol, monomethyl ether acetate, ethyl lactate, □-butyrolactone, and cyclohexanorie.

In another exemplary embodiment of the present invention, the quencher comprises at least one of an aromatic amine, an aliphatic amine such as 2-phenylbenzimidazole, or a t-alkyl ammonium hydroxide such as t-butyl ammonium hydroxide (TBAH).

In another exemplary embodiment of the present invention, the surfactant comprises at least one of a fluorine-containing surfactant and a siloxane-containing surfactant.

In another exemplary embodiment of the present invention, the positive photoresist composition comprises about 1 to about 30 wt. % of the polymer, about 0.5 to about 20 wt. % of the acid generator, based on the total weight of the polymer, and about 70 to about 99 wt. % of the solvent.

In another exemplary embodiment of the present invention, the positive photoresist composition comprises about 5 to about 15 wt. % of the polymer, about 0.5 to about 10 wt. % of the acid generator, based on the total weight of the polymer, and about 85 to about 95 wt. % of the solvent.

In another exemplary embodiment of the present invention, the positive photoresist composition further comprises about 0.1 to about 1.0 wt. % of the quencher, based on the total weight of the polymer, and about 0.001 to about 0.1 wt. % of the surfactant, based on the total weight of the polymer.

In another exemplary embodiment of the present invention, a method of making a patterned photoresist layer on a substrate for subsequent processing of a correspondingly patterned substrate is disclosed. The method includes depositing a positive photoresist composition on the substrate to form a positive photoresist layer, the positive photoresist composition comprising a radiation sensitive acid generator and a polymer, the polymer comprising a first repeating unit derived from a fluorosulfonamide monomer including one of the following two structures,

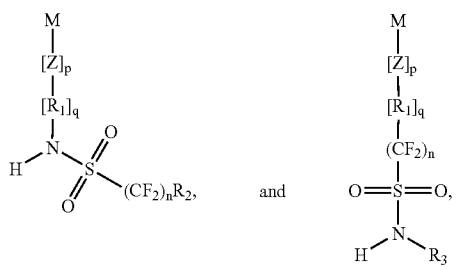

in which M is a polymerizable backbone moiety, Z is a linking moiety comprising one of —C(O)O—, —C(O)—, —OC(O)—, —O—C(O)—C(O)—O—, $R_1$ represents one of an alkyl, an aryl, a semi- or perfluorinated alkyl, and a semi- or perfluorinated aryl, p and q is 0 or 1, $R_2$ represents one of hydrogen, fluorine, an alkyl group of 1 to 6 carbons, and a semi- or perfluorinated alkyl group of 1 to 6 carbons, n is an integer from 1 to 6, and $R_3$ represents one of hydrogen, an alkyl, an aryl, a semi- or perfluorinated alkyl, and a semi- or perfluorinated aryl, and exposing the positive photoresist layer to a pattern of imaging radiation, removing a portion of the positive photoresist layer that is exposed to the pattern of imaging radiation to reveal a pattern of the substrate, which corresponds to the pattern of imaging radiation, and subsequently processing the pattern of the substrate.

In another exemplary embodiment of the present invention, the removing a portion of the positive photoresist layer is accomplished by contacting the positive photoresist layer with an aqueous base developer.

In another exemplary embodiment of the present invention, the subsequently processing comprises one of etching the pattern of the substrate and implanting ions in the pattern of the substrate.

In another exemplary embodiment of the present invention, the substrate comprises one of a dielectric, a semiconductor, a conductor, and a ceramic.

In another exemplary embodiment of the present invention, the imaging radiation is 193 nm.

In another exemplary embodiment of the present invention, the imaging radiation is 157 nm.

The above and other exemplary aspects of the present invention will be better appreciated and understood when considered with the following description. It should be understood, however, that the following description, while indicating exemplary embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE FIGURES

The foregoing and other exemplary aspects of the present invention will be better understood from the following detailed description of exemplary embodiments of the present invention with reference to the figure in which.

DETAILED DESCRIPTION OF EXEMPLARY EMBODIMENTS OF THE INVENTION

Figure 1:
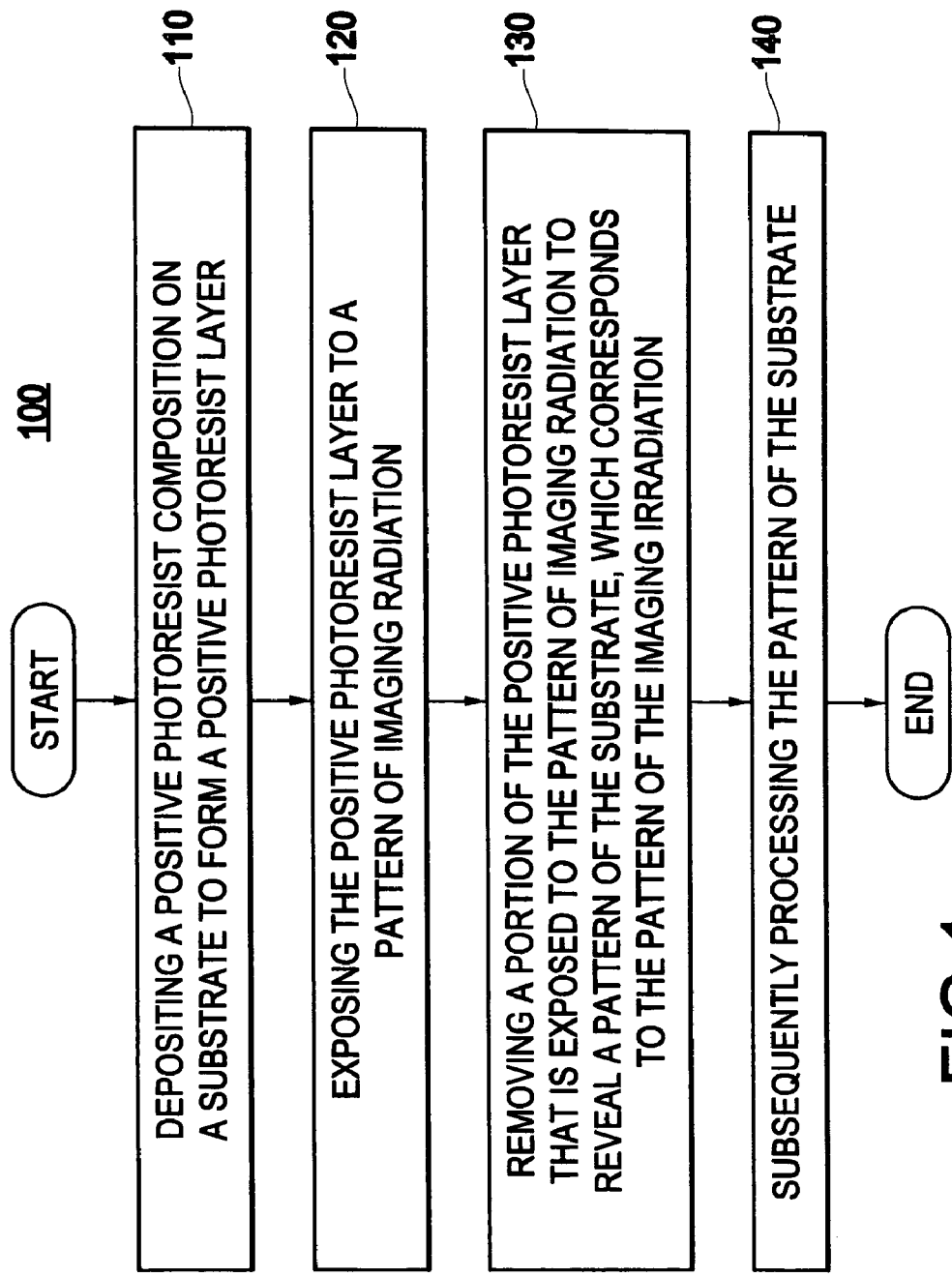
FIG. 1 provides a flowchart 100 that illustrates a method of making a patterned photoresist layer on a substrate for subsequent processing of a correspondingly patterned substrate in an exemplary embodiment of the present invention.

Generally, photoresists may comprise a polymeric matrix, a radiation sensitive component such as, for example, a radiation sensitive acid generator, a solvent, and other performance enhancing additives, for example, a quencher, and a surfactant.

An exemplary embodiment of the present invention is directed to a positive photoresist composition that comprises a polymer that may form a polymeric matrix. The polymer may comprise a first repeating unit derived from a sulfonamide monomer including a fluorosulfonamide functionality, and a second monomer unit, including a pendant acid labile group.

Alternatively, the polymer may further include a third monomer unit, including a pendant lactone group. A positive photoresist with fluorosulfonamide functionalities contains less fluorine than conventional photoresist polymers including acidic groups of hexafluoroacohol (HFA), a feature that may improve etch resistance of the photoresist material.

In addition, the fluorosulfonamide functionality has a stronger acidity than the HFA group used in conventional photoresists, so that a lower concentration of the fluorosulfonamide functionality may be used to achieve a desired dissolution property in the present invention, further improving the etch resistance of the positive photoresist. The incorporation of the fluorosulfonamide functionality also results in good dissolution properties, for example, a slight dissolution in the unexposed areas of positive photoresist and a fast dissolution in the exposed areas of positive photoresist at the same time.

More specifically, the first repeating unit of the polymer of the present invention may be derived from a fluorosulfonamide monomer including one of the following two structures:

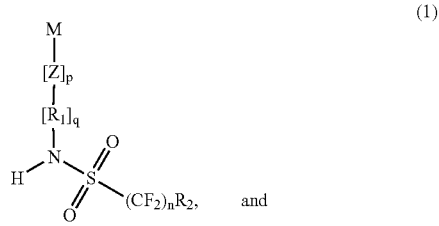

(1)

-continued

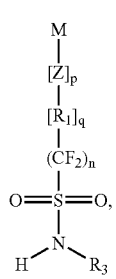
(2)

in which M is a polymerizable backbone moiety, Z is a linking moiety comprising one of —C(O)O—, —C(O)—, —OC(O)—, —O—C(O)—C(O)—O—, $R_1$ represents one of an alkyl, an aryl, a semi- or perfluorinated alkyl, and a semi- or perfluorinated aryl, p and q is 0 or 1, $R_2$ represents one of hydrogen, fluorine, an alkyl group of 1 to 6 carbons, and a semi- or perfluorinated alkyl group of 1 to 6 carbons, n is an integer from 1 to 6, and $R_3$ represents one of hydrogen, an alkyl, an aryl, a semi- or perfluorinated alkyl, and a semi- or perfluorinated aryl.

Examples of the polymerizable backbone moiety, M, may include:

where $R_4$ represents hydrogen, a linear or branched alkyl group of 1 to 20 carbons, a semi- or perfluorinated linear or branched alkyl group of 1 to 20 carbons, or CN; and

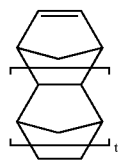

where t is an integer from 0 to 3.

In various exemplary embodiments of the present invention, the first monomer, which includes a fluorosulfonamide functionality, may include:

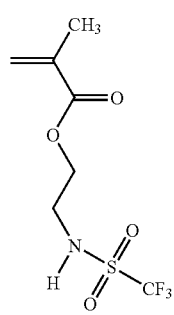
(I)

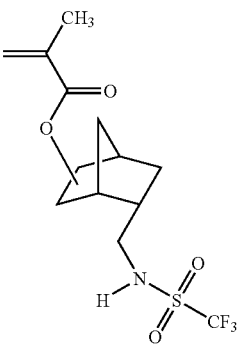
(II)

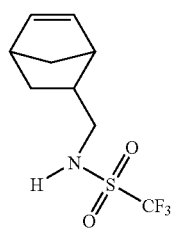
(III)

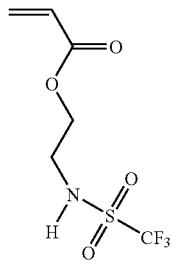
(IV)

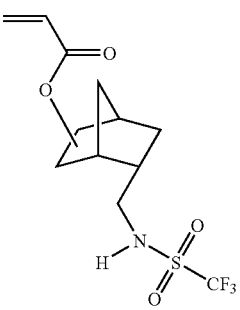
(V)

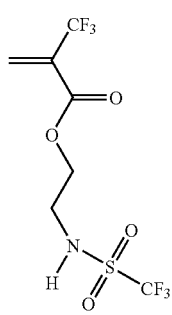
(VI)

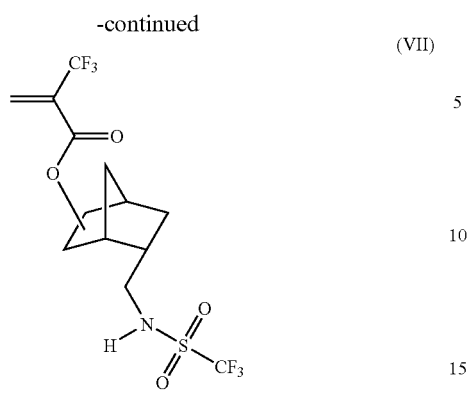
(VII)
In various exemplary embodiments, the second monomer unit of the present invention may include acid-labile pendant moieties, such as tertiary alkyl carbonates, tertiary alkyl esters, tertiary alkyl ethers, acetals, and ketals. Examples of such a second monomer including a tertiary alkyl ester may include:
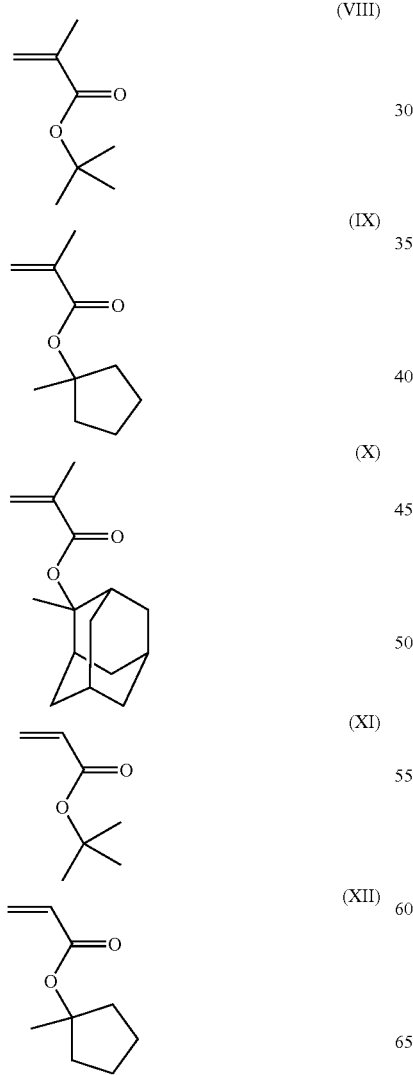
(VIII)
(IX)
(X)
(XI)
(XII)
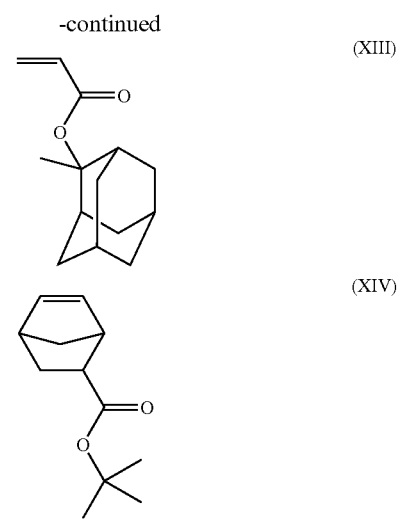
(XIII)
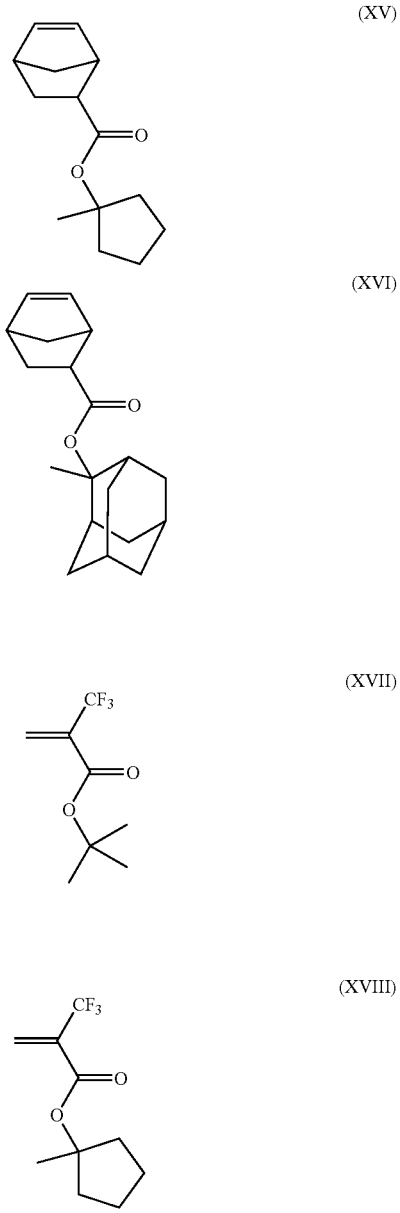
(XIV)
(XV)
(XVI)
(XVII)
(XVIII)

-continued
(XIX)
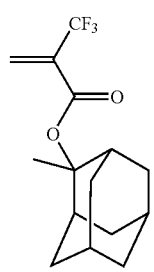
(XX)
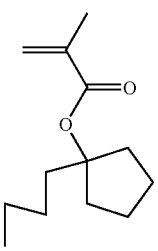
(XXI)
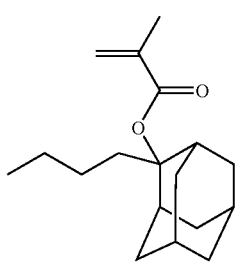
(XXII)
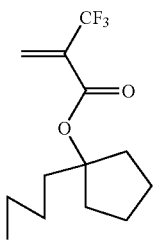
(XXIII)
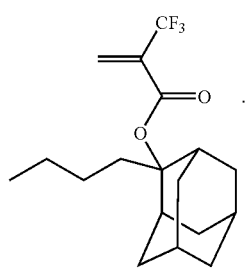
Alternatively, the third monomer unit of the polymer of the present invention may allow for further regulation of, for example, dissolution properties, thermal properties, and etch resistance in various exemplary embodiments. Examples of such a third monomer may include:
(XXIV)
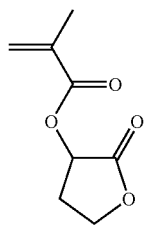
(XXV)
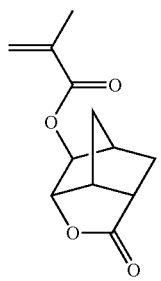
(XXVI)
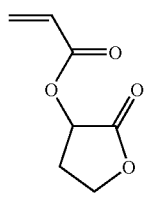
(XXVII)
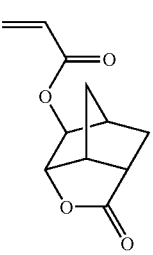
(XXVIII)
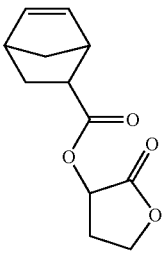
(XXIX)
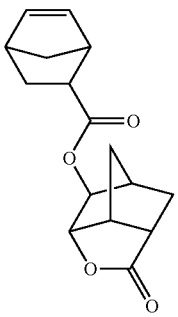

-continued

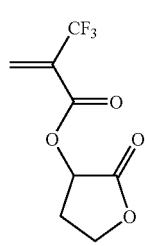
(XXX)

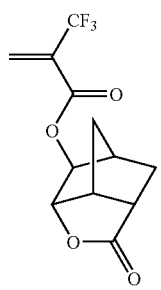
(XXXI)

In various exemplary embodiments, radiation sensitive acid generators, also known as photoacid generators, may be used in the photoresist composition of the invention. These photoacid generators are compounds that generate an acid upon exposure to radiation. In various exemplary embodiments, any suitable photoacid generating agent may be used, so long as a mixture of the aforementioned photoresist composition of the present invention and the selected photoacid generator dissolve sufficiently in an organic solvent and the resulting solution thereof may form a uniform film by a film-forming process, such as spin coating or the like. As is well known to those skilled in the art after reading the present application, the following illustrative classes of photoacid generators may be employed in various exemplary embodiments of the present invention: onium salts, succinimide derivatives, diazo compounds, nitrobenzyl compounds, and the like. To minimize acid diffusion for high resolution capability, the photoacid generators may be such that they generate bulky acids upon exposure to radiation. Such bulky acids may include at least 4 carbon atoms.

A preferred photoacid generator that may be employed in the present invention is an onium salt, such as an iodonium salt or a sulfonium salt, and/or a succinimide derivative. In various exemplary embodiments of the present invention, the preferred photoacid generator may include 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl) iodonium perfluorohexane sulfonate, di(t-butylphenyl)iodonium perfluoroethylcyclohexane sulfonate, di(t-buylphenyl) iodonium camphoresulfonate, and perfluorobutylsulfonyloxybicylo[2.2.1]-hept-5-ene-2,3-dicarboximide. Any of these photoacid generators may be used singly or in a mixture of two or more.

The specific photoacid generator selected will depend on the irradiation being used for patterning the photoresist. Photoacid generators are currently available for a variety of different wavelengths of light from the visible range to the X-ray range; thus, imaging of the photoresist can be performed using deep-UV, extreme-UV, e-beam, laser, or any other selected irradiation source that is deemed useful.

As stated above, the positive photoresist composition of the present invention may further comprise a solvent, and other performance enhancing additives, for example, a quencher and a surfactant.

Solvents well known to those skilled in the art may be employed in the photoresist composition of various exemplary embodiments of the present invention. Such solvents may be used to dissolve the fluorosulfonamide-containing polymer and other components of the photoresist composition. Illustrative examples of such solvents may include, but are not limited to: ethers, glycol ethers, aromatic hydrocarbons, ketones, esters and the like. Preferred solvents may include propylene glycol, monomethyl ether acetate, ethyl lactate, □-butyrolactone, and cyclohexanone. Any of these solvents may be used singly or in a mixture of two or more.

The quencher that may be used in the photoresist composition of the invention may comprise a weak base that scavenges trace acids, while not having an excessive impact on the performance of the positive photoresist. Illustrative examples of such quenchers may include aromatic or aliphatic amines, such as 2-phenylbenzimidazole, or t-alkyl ammonium hydroxides, such as t-butyl ammonium hydroxide (TBAH).

The surfactants, which may be used in the photoresist composition of the invention, may improve the coating homogeneity of the positive photoresist compositions of the invention. Illustrative examples of such surfactants may include fluorine-containing surfactants, such as 3M's FC-430®, siloxane-containing surfactants such as Union Carbide's SILWET® series, and the like.

In various exemplary embodiments of the present invention, the photoresist composition of the invention may comprise:

(i) about 1 to about 30 wt. % of the polymer including a fluorosulfonamide functionality, more preferably about 5 to about 15 wt. %;

(ii) about 0.5 to about 20 wt. % of photoacid generator, based on the total weight of the polymer, more preferably about 0.5 to about 10 wt. %; and (iii) a solvent, which may typically be present in amounts of about 70 to about 99 wt. % of the composition, more preferably about 85 to about 95 wt. %.

In various exemplary embodiments, the photoresist composition may further comprise a quencher, which may typically be present in amounts of about 0.1 to about 1.0 wt. % based on the total weight of the polymer, and a surfactant, which may typically be present in amounts of about 0.001 to about 0.1 wt. % based on the total weight of the polymer.

In an exemplary embodiment of the present invention, the various examples of a positive photoresist composition described above, may be used as an imaging layer in the manufacture of semiconductor devices. The positive photoresist may be applied by means well known in the art, such as spin-coating, to a selected substrate. The selected substrate upon which the positive photoresist is applied, may then preferably be baked (pre-exposure bake) to remove the solvent and to improve the coherence of the photoresist imaging layer. In various exemplary embodiments, a typical pre-exposure baking temperature may be about 80° C. to about 150° C. and a typical photoresist thickness may be about 100 nm to about 500 nm.

In various exemplary embodiments of the present invention, the positive photoresist may be exposed through a patterned mask to an appropriate irradiation source. Exposure to the appropriate irradiation source may be followed by a post-exposure baking and subsequent development of the photoresist imaging layer in an aqueous base developer, for example, 0.263 N TMAH developer, which removes those portions of the positive photoresist that have been exposed to the irradiation source to form the pattern of the photoresist imaging layer.

The pattern of the photoresist imaging layer comprises areas from which a portion of the photoresist layer has been removed and areas, where the remaining portion of the photoresist layer has not been removed. Where the portion of the photoresist layer has been removed, an underlying substrate material, for example, an antireflective layer, a semiconductor, a dielectric, a conductor, a ceramic, etc., is revealed, such that the revealed substrate material corresponds to the pattern of the photoresist imaging layer. This revealed pattern of substrate material is now available for subsequent processing, such as, for example, etching and ion implantation, used in the series of processes for manufacturing a semiconductor device.

FIG. 1 illustrates a flow chart 100 that outlines the method of making a positive photoresist layer on a substrate including depositing a positive photoresist composition on a substrate to form a positive photoresist layer 110, exposing the positive photoresist layer to a pattern of imaging radiation 120, removing a portion of the positive photoresist layer that is exposed to the pattern of imaging radiation 130, and revealing a pattern of the substrate, which corresponds to the pattern of imaging radiation, for subsequent processing 140.

In various exemplary embodiments of the present invention, the positive photoresist composition of the present invention may be used to create a photoresist imaging layer, which may in turn be used to create a patterned underlying substrate material structure, such as a metal wiring line, a hole for a contact or a via, an insulating structure, e.g., a damascene trench or a shallow isolation trench, or a trench for use in a capacitative structure, etc. that may be used in the manufacture of a semiconductor integrated circuit.

The following examples are provided to further illustrate exemplary embodiments of the present invention.

EXAMPLE 1

Synthesis of Poly(I-co-VIII-co-XVI)

0.2 g (0.0012 mol) of 2,2'-azobisisobutyronitrile (AIBN) was added to a solution of 1.57 g (0.006 mol) of 2-trifluoromethanesulfonylaminoethyl methacrylate (I), 4.21 g (0.018 mol) of 2-methyl-2-adamantyl methacrylate (VIII), 3.55 g (0.016 mol) of 5-methacryloyloxy-2,6-norbornanecarbolactone (XVI) and 0.081 g (0.0004 mol) dodecanethiol in 28 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 2

Lithographic Evaluation

For the purpose of evaluative lithographic experiments, a photoresist formulation containing Poly(I-co-VIII-co-XVI) (Example 1) was prepared by combining the materials set forth below, expressed in part by weight.

| | |
|---|---|
| Propylene glycol monomethyl ether acetate | 90 |
| Poly(I-co-VIII-co-XVI) | 9.50 |
| 4-(1-Butoxynaphthyl)tetrahydrothiophenium perfluorooctanesulfonate | 0.475 |
| 2-Phenylbenzimidazole | 0.025 |

The prepared photoresist formulation was spin-coated for 30 seconds onto an antireflective material ($AR_{40}$, Shipley Company) layer applied on silicon wafers. The photoresist layer was soft-baked at 130° C. for 60 seconds on a vacuum hot plate to produce a film thickness of about 0.24 µm. The wafers were then exposed to 193 nm radiation (ASML scanner, 0.75 NA). The exposure pattern was an array of lines and spaces of varying dimensions down to 0.09 µm. The exposed wafers were post-exposure baked on a vacuum hot plate at 130° C. for 90 seconds. The wafers were then puddle developed using 0.263 N TMAH developer for 60 seconds. The resulting patterns of the photoresist imaging layer were then examined by scanning electron microscopy (SEM). Patterns of line/space pairs of 110 nm, i.e., 0.11 µm, and above were readily distinguished and appeared sharply defined with little or no blurring.

While the invention has been described in terms of exemplary embodiments, those skilled in the art will recognize that the present invention may be practiced with modifications within the spirit and scope of the appended claims.

Further, it is noted that Applicants' intent is to encompass equivalents of all claim elements, even if amended later during prosecution.

What is claimed is:

1. A positive photoresist composition comprising:
a radiation sensitive acid generator; and
a polymer, the polymer comprising:
a first repeating unit derived from a fluorosulfonamide monomer including one of the following two structures,

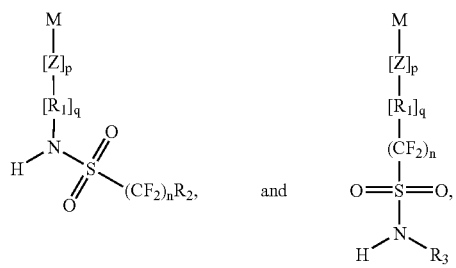

in which M comprises a polymerizable backbone moiety, Z comprises a linking moiety comprising one of —C(O)O—, —C(O)—, —OC(O), O—C(O)—C(O)—O—, $R_1$ represents one of an alkyl, an aryl, a semi- or perfluorinated alkyl, and a semi- or perfluorinated aryl, p and q are 0 or 1, $R_2$ represents one of hydrogen, fluorine, an alkyl group of 1 to 6 carbons, and a semi- or perfluorinated alkyl group of 1 to 6 carbons, n comprises an integer from 1 to 6, and $R_3$ represents one of hydrogen, an alkyl, aryl, a semi- or perfluorinated alkyl, and a semi- or perfluorinated aryl;

a second repeating unit including a pendant acid-labile moiety; and a third repeating unit derived from monomers comprising one of the following structures, (XXIV)
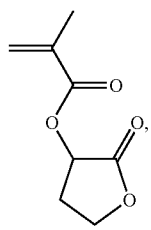

(XXV)
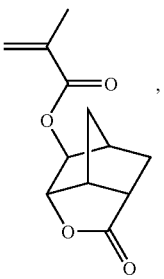

(XXVI)
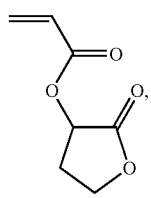

(XXVII)
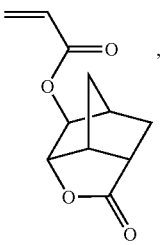

(XXVIII)
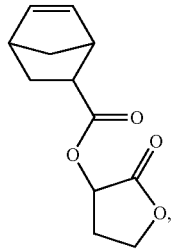

(XXIX)
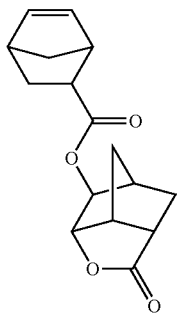

(XXX)
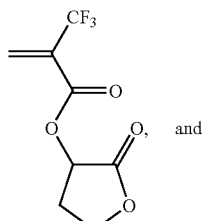
and (XXXI)
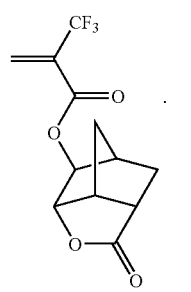

wherein said polymer comprises about 15 mole % of said first repeating unit.

2. The positive photoresist composition of claim 1, wherein the polymerizable backbone moiety, M, includes one of the following structures,

where $R_4$ represents one of hydrogen, an alkyl group of 1 to 20 carbons, a semi- or perfluorinated alkyl group of 1 to 20 carbons, and CN, and

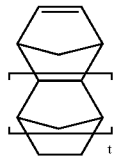

where t comprises an integer from 0 to 3.

3. The positive photoresist composition of claim 1, wherein the sulfonamide monomer, which includes a fluorosulfonamide functionality, comprises one of the following structures, (I)
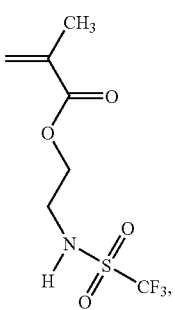

-continued

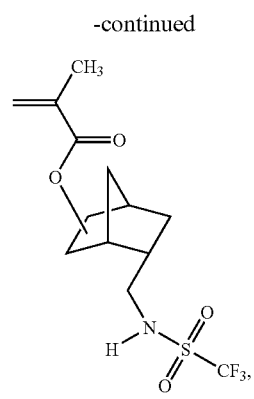
(II)

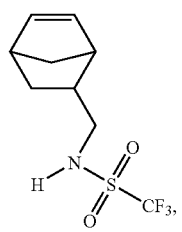
(III)

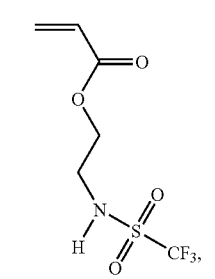
(IV)

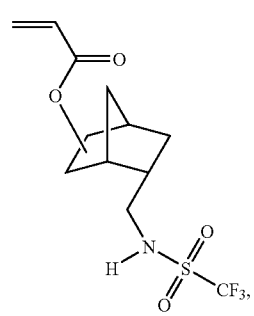
(V)

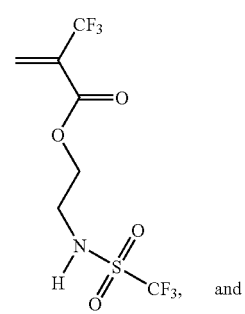
(VI)

-continued

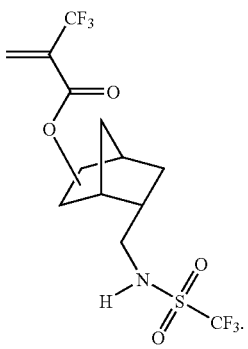
(VII)

4. The positive photoresist composition of claim 1, wherein the second repealing unit including the acid-labile pendant moiety comprises one of a tertiary alkyl carbonate, a tertiary alkyl ester, a tertiary alkyl ether, an acetal and a ketal.

5. The positive photoresist composition of claim 4, wherein the tertiary alkyl ester monomer includes one of the following structures,

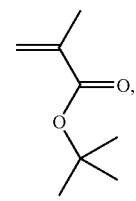
(VIII)

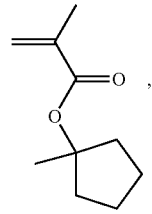
(IX)

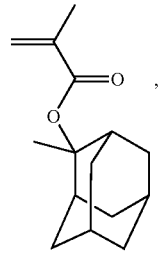
(X)

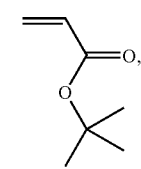
(XI)

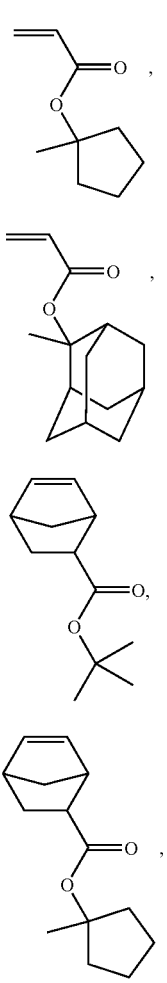
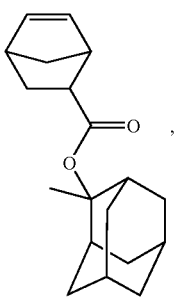
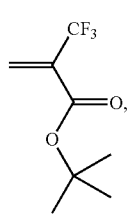
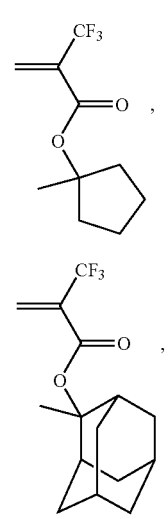
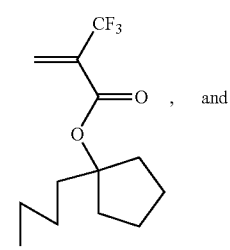
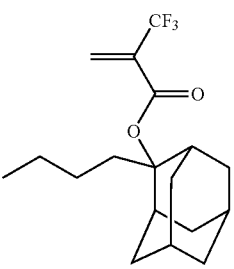

6. The positive photoresist composition of claim 1, wherein the radiation sensitive acid generator comprises at least one of an onium salt, a succinimide derivative, a diazo compound, and a nitrobenzly compound.

7. The positive photoresist composition of claim 6, wherein the radiation sensitive acid generator comprises at least one of 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl)iodonium perfluorohexane sulfonate, di(t-butylphenyl)iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide.

8. The positive photoresist composition of claim 1, further comprising at least one of a solvent, a quencher, and a surfactant.

9. The positive photoresist composition of claim 8, wherein the solvent comprises at least one of an ether, a glycol ether, an aromatic hydrocarbon, a ketone, and an ester.

10. The positive photoresist composition of claim 8, wherein the solvent comprises at least one of propylene glycol, monomethyl ether acetate, ethyl lactate, γ- butyrolantone, and cyclohexanone.

11. The positive photoresist composition of claim 8, wherein the quencher comprises at least one of an aromatic amine, an aliphatic amine, and a t-alkyl ammonium hydroxide.

12. The positive photoresist composition of claim 8, wherein the surfactant comprises at least one of a fluorine-containing surfactant and a siloxane-containing surfactant.

13. The positive photoresist composition of claim 8, wherein the positive photoresist composition comprises:
   about 1 to about 30 wt. % of the polymer;
   about 0.5 to about 20 wt. % of the acid generator, based on the total weight of the polymer; and
   about 70 to about 99 wt. % of the solvent.

14. The positive photoresist composition of claim 13, wherein the positive photoresist composition comprises:
   about 5 to about 15 wt. % of the polymer;
   about 0.5 to about 10 wt. % of the acid generator, based on the total weight of the polymer; and
   about 85 to about 95 wt. % of the solvent.

15. The positive photoresist composition of claim 13, wherein the positive photoresist composition further comprises:
   about 0.1 to about 1.0 wt. % of the quencher, based on the total weight of the polymer; and
   about 0.001 to about 0.1 wt. % of the surfactant, based on the total weight of the polymer.

16. The positive photoresist composition of claim 1, wherein said polymer consists of said first repeating unit, said second repeating unit and said third repeating unit.

17. A positive photoresist composition comprising:
   a radiation sensitive acid generator; and
   a polymer, the polymer comprising:
      a first repeating unit derived from a fluorosulfonamide monomer including one of the following two structures,

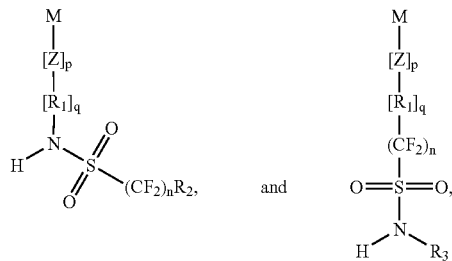

in which M comprises a polymerizable backbone moiety, Z comprises a linking moiety comprising one of —C(O)O—, —C(O)—, —OC(O)—, —O—C(O)—C(O)—O—, $R_1$ represents one of an alkyl, an aryl, a semi- or perfluorinated alkyl, and a semi- or perfluorinated aryl, p and q are 0 or 1, $R_2$ represents one of hydrogen, fluorine, an alkyl group of 1 to 6 carbons, and a semi- or perfluorinated alkyl group of 1 to 6 carbons, n comprises an integer from 1 to 6, and $R_3$ represents one of hydrogen, an alkyl, an aryl, a semi- or perfluorinated alkyl, and a semi- or perfluorinated aryl;
      a second repeating unit including a pendant acid-labile moiety; and
      a third repeating unit derived from monomers comprising one of the following structures,

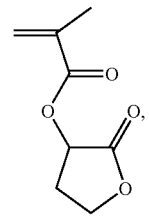

(XXIV)

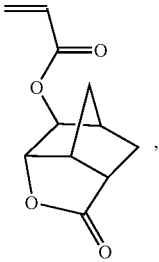

(XXV)

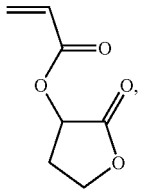

(XXVI)

-continued (XXVII)
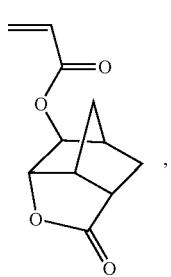

(XXVIII)
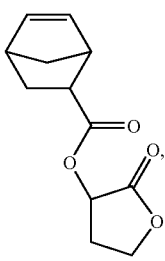

(XXIX)
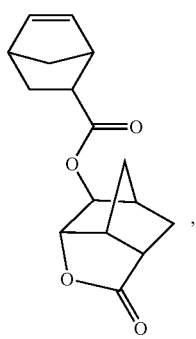

(XXX)
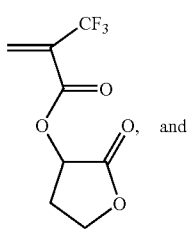
and (XXXI)
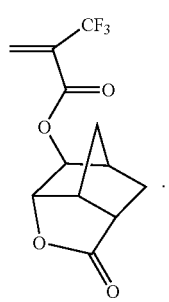

wherein said polymer comprises:
about 15 mole % of said first repeating unit;
about 45 mole % of said second repeating unit; and
about 40 mole % of said third repeating unit.

18. A positive photoresist composition comprising:
a radiation sensitive acid generator; and
a polymer, the polymer comprising:
a first repeating unit derived from a fluorosulfonamide monomer including one of the following two structures,

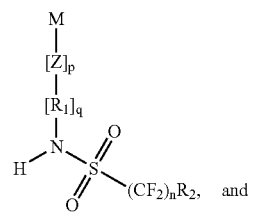 and

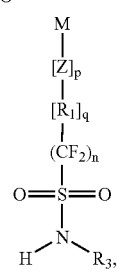

in which M comprises a polymerizable backbone moiety, Z comprises a linking moiety comprising one of —C(O)O—, —C(O)—, —OC(O)—, —O—C(O)—C(O)—O—, $R_1$ represents one of an alkyl, an aryl, a semi- or perfluorinated alkyl, and a semi- or perfluorinated aryl, p and q are 0 or 1, $R_2$ represents one of hydrogen, fluorine, an alkyl group of 1 to 6 carbons, and a semi- or perfluorinated alkyl group of 1 to 6 carbons, n comprises an integer from 1 to 6, and $R_3$ represents one of hydrogen, an alkyl, an aryl, a semi- or perfluorinated alkyl, and a semi- or perfluorinated aryl;
a second repeating unit including a pendant acid-labile moiety; and
a third repeating unit derived from monomers comprising one of the following structures, (XXIV)
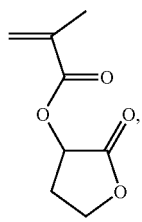

(XXV)
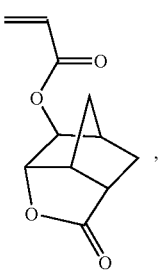

-continued

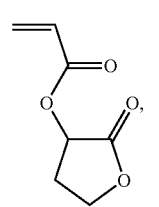
(XXVI)

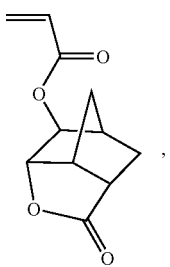
(XXVII)

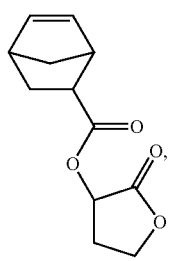
(XXVIII)

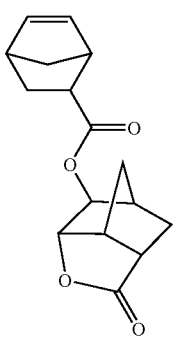
(XXIX)

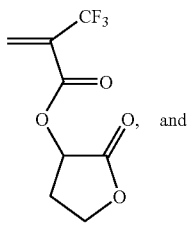
(XXX)

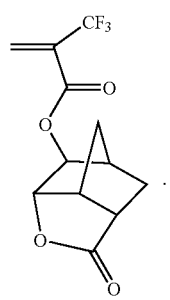
(XXXI)

wherein said polymer comprises:
about 15 mole % of sulfonamide;
about 40 mole % of lactone; and
about 45 mole % of acid labile group.

19. A positive photoresist composition comprising:
a radiation sensitive acid generator; and
a polymer, the polymer comprising:
a first repeating unit derived from a fluorosulfonamide monomer including one of the following two structures,

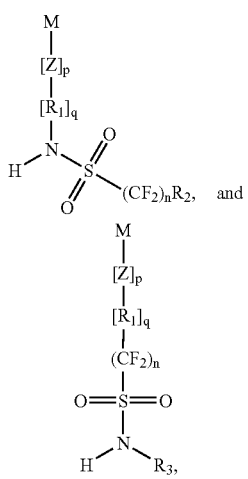

in which M comprises a polymerizable backbone moiety, Z comprises a linking moiety comprising one of —C(O)O—, —C(O)—, —OC(O)—, —O—C(O)—C(O)—O—, $R_1$ represents one of an alkyl, an aryl, a semi- or perfluorinated alkyl, and a semi- or perfluorinated aryl, p and q are 0 or 1, $R_2$ represents one of hydrogen, fluorine, an alkyl group of 1 to 6 carbons, and a semi- or perfluorinated alkyl group of 1 to 6 carbons, n comprises an integer from 1 to 6, and $R_3$ represents one of hydrogen, an alkyl, an aryl, a semi- or perfluorinated alkyl, and a semi- or perfluorinated aryl;
a second repeating unit including a pendant acid-labile moiety; and
a third repeating unit derived from monomers comprising one of the following structures,

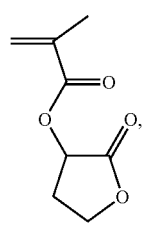
(XXIV)

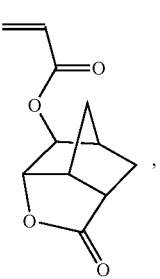
(XXV)

-continued
(XXVI)
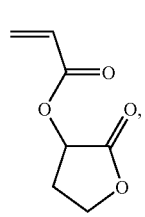
(XXVII)
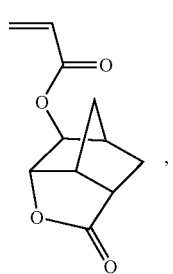
(XXVIII)
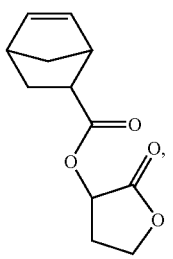
-continued
(XXIX)
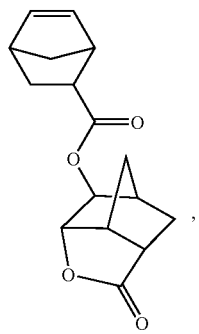
(XXX)
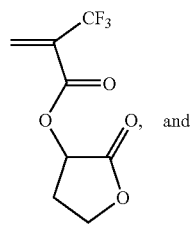
and
(XXXI)
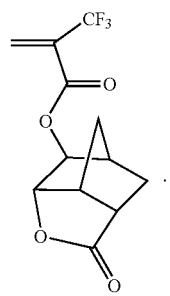
wherein said polymer comprises about 15 mole % of sulfonamide.
* * * * *